(12) United States Patent
Chang

(10) Patent No.: US 7,786,800 B2
(45) Date of Patent: Aug. 31, 2010

(54) CLASS AB AMPLIFIER

(75) Inventor: Wien-Hua Chang, Tainan County (TW)

(73) Assignee: Realtek Semiconductor Corp., Hsinchu (TW)

( * ) Notice: Subject to any disclaimer, the term of this patent is extended or adjusted under 35 U.S.C. 154(b) by 73 days.

(21) Appl. No.: 12/125,958

(22) Filed: May 23, 2008

(65) Prior Publication Data

US 2008/0297254 A1 Dec. 4, 2008

(30) Foreign Application Priority Data

May 29, 2007 (TW) .............................. 96119127 A

(51) Int. Cl.
*H03F 3/45* (2006.01)
(52) U.S. Cl. ...................................... 330/255; 330/264
(58) Field of Classification Search ................. 330/255, 330/264, 253, 257
See application file for complete search history.

(56) References Cited

U.S. PATENT DOCUMENTS 7,209,005 B2 * 4/2007 Martins ...................... 330/255

* cited by examiner

*Primary Examiner*—Robert Pascal
*Assistant Examiner*—Hieu P Nguyen
(74) *Attorney, Agent, or Firm*—McNees Wallace & Nurick, LLP

(57) ABSTRACT

A class AB amplifier includes: a voltage amplifier stage operating off a first source voltage, and amplifying a differential input voltage to produce a first amplified voltage; a level shift stage coupled to the voltage amplifier stage and adjusting a direct current level of the first amplified voltage to produce a first shift voltage; and a power amplifier stage coupled to the level shift stage, operating off a second source voltage, and converting the first shift voltage to produce a first output current. The second source voltage is larger than the first source voltage.

19 Claims, 7 Drawing Sheets

CLASS AB AMPLIFIER

CROSS-REFERENCE TO RELATED APPLICATION

This application claims priority of Taiwanese Application No. 096119127, filed on May 29, 2007.

BACKGROUND OF THE INVENTION

1. Field of the Invention

The present invention relates to an amplifier, more particularly to a class AB amplifier.

2. Description of the Related Art

Referring to FIG. 1, a conventional class AB amplifier comprises a voltage amplifier stage 11 and a power amplifier stage 12. The conventional class AB amplifier amplifies a differential input voltage and converts a resulting amplified voltage into an output current. The voltage amplifier stage 11 typically uses a floating gate structure, and includes first to third p-channel metal-oxide-semiconductor field-effect transistors (PMOS transistors) 111-113, and first to third n-channel metal-oxide-semiconductor field-effect transistors (NMOS transistors) 114-116. Alternating current fluctuations of a voltage at node (A) are related to the differential input voltage. The power amplifier stage 12 includes a fourth PMOS transistor 121 and a fourth NMOS transistor 122.

The voltage amplifier stage 11 and the power amplifier stage 12 must operate using the same source voltage ($V_{DD}$) due to the fact that the voltage amplifier stage 11 is able to operate normally only when the following equations are satisfied:

$$V_{gs,114} + V_{gs,122} = V_{gs,115} + V_{gs,116}$$

$$V_{sg,111} + V_{sg,121} = V_{sg,112} + V_{sg,113}$$

where $V_{gs,X}$ is a voltage difference between a gate and a source of NMOS transistor (X), and $V_{sg,X}$ is a voltage difference between a source and a gate of PMOS transistor (X).

However, a drawback of the conventional class AB amplifier described above is that a high voltage swing and a high current drive capability of the power amplifier stage 12, which are obtained by using a high source voltage ($V_{DD}$), are achieved at the expense of a high power consumption of the voltage amplifier stage 11.

SUMMARY OF THE INVENTION

Therefore, the object of this invention is to provide a class AB amplifier that achieves a high voltage swing and a current drive capability while keeping power consumption low.

The class AB amplifier of this invention comprises: a voltage amplifier stage operating off a first source voltage, and amplifying a differential input voltage to produce a first amplified voltage; a level shift stage coupled to the voltage amplifier stage and adjusting a direct current level of the first amplified voltage to produce a first shift voltage; and a power amplifier stage coupled to the level shift stage, operating off a second source voltage, and converting the first shift voltage to produce a first output current. The second source voltage is larger than the first source voltage.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
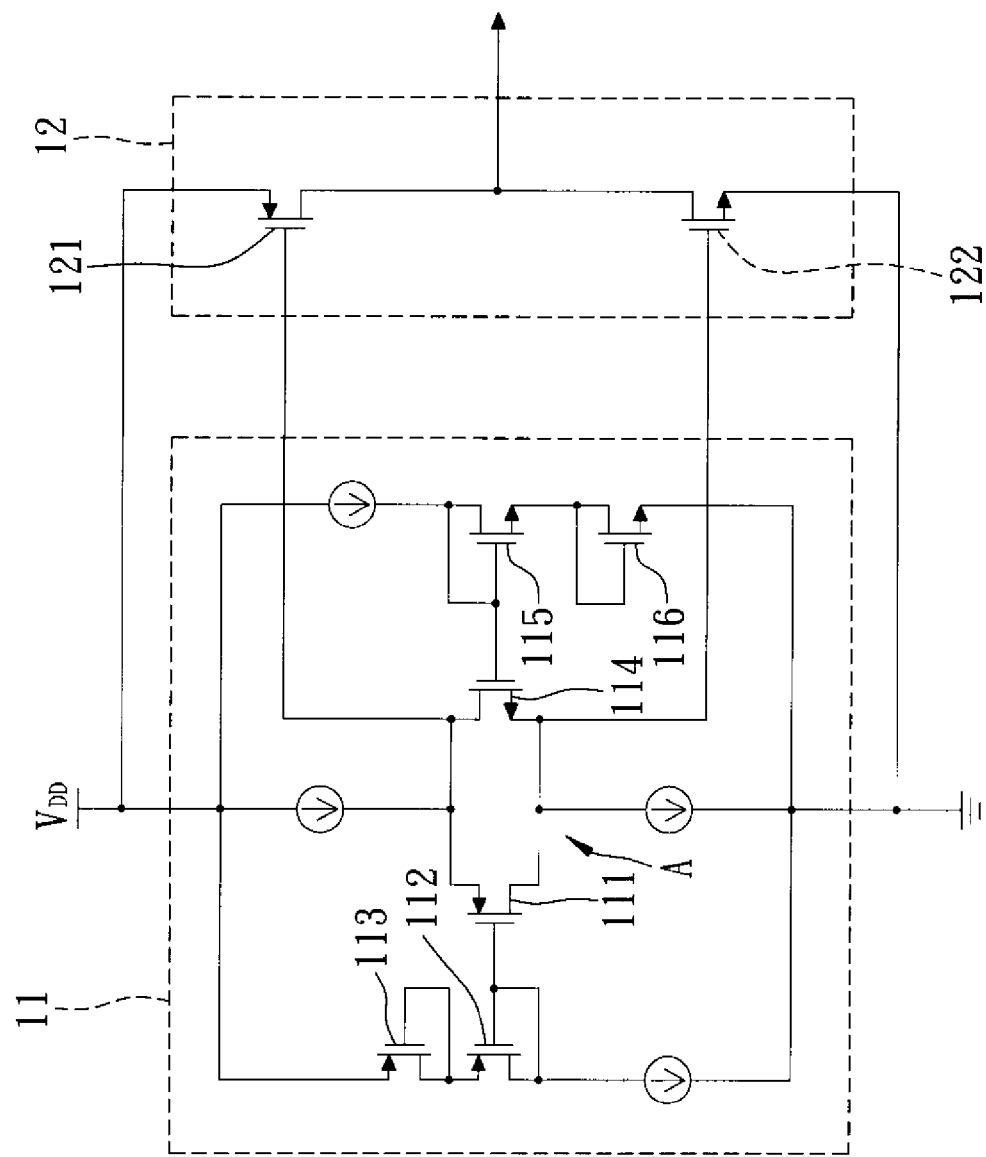
FIG. 1 is a schematic circuit diagram of a conventional class AB amplifier.
Figure 2:
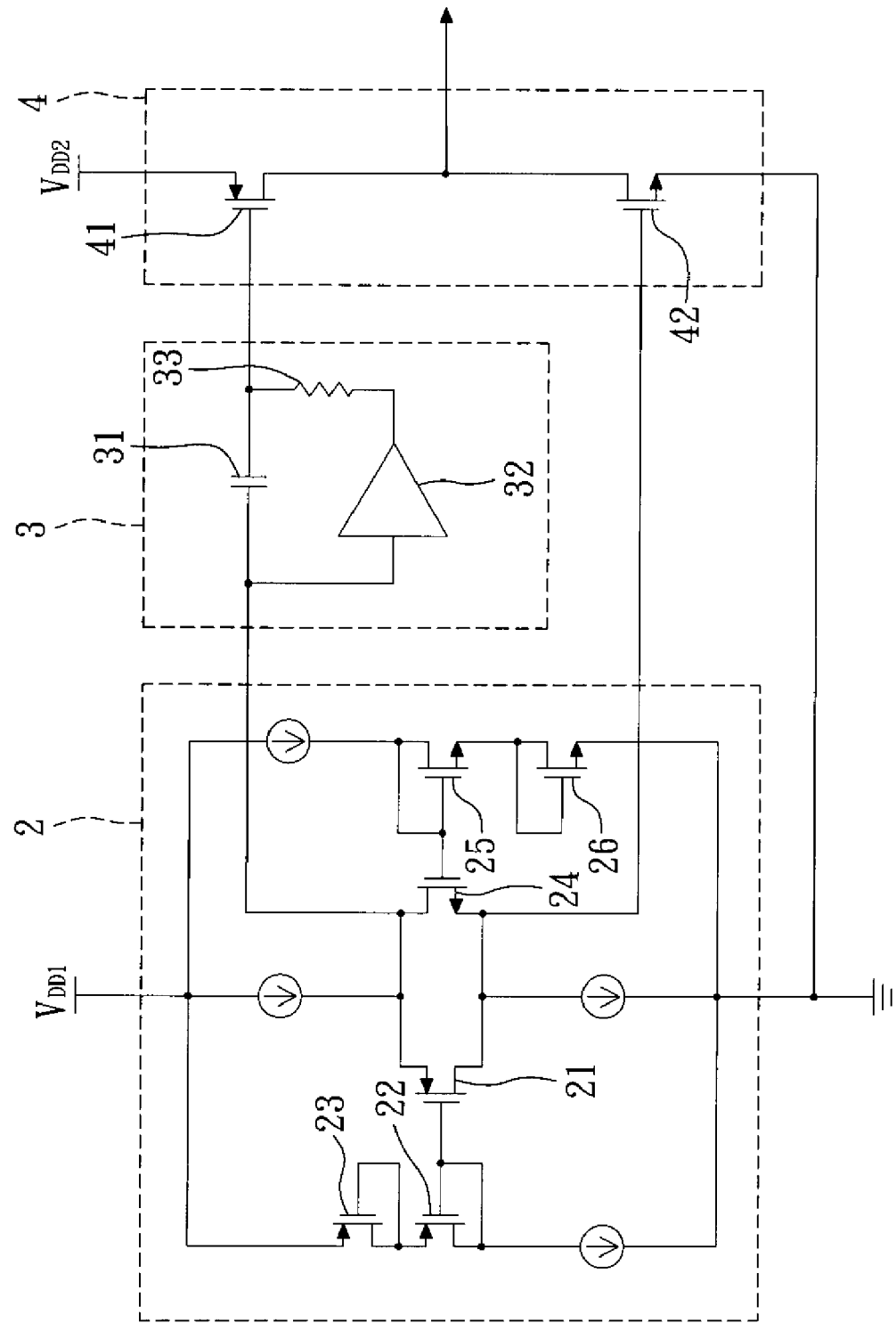
FIG. 2 is a schematic circuit diagram of a class AB amplifier according to a first preferred embodiment of the present invention.

Referring to FIG. 2, a first preferred embodiment of a class AB amplifier according to the present invention comprises a voltage amplifier stage 2, a level shift stage 3, and a power amplifier stage 4. The voltage amplifier stage 2 operates off a first source voltage ($V_{DD1}$), and amplifies a differential input voltage to produce a first amplified voltage. The level shift stage 3 is coupled to the voltage amplifier stage 2 and adjusts a direct current (DC) level of the first amplified voltage to produce a first shift voltage. The power amplifier stage 4 is coupled to the level shift stage 3, operates off a second source voltage ($V_{DD2}$), and converts the first shift voltage to produce a first output current. The second source voltage ($V_{DD2}$) is larger than the first source voltage ($V_{DD1}$).

The voltage amplifier stage 2 may have a floating gate structure. In this embodiment, the voltage amplifier stage 2 includes first to third PMOS transistors 21-23 and first to third NMOS transistors 24-26. A source of the first PMOS transistor 21 and a drain of the first NMOS transistor 24 are coupled to each other, receive a current, and output an amplified voltage. A drain of the first PMOS transistor 21 and a source of the first NMOS transistor 24 are coupled to each other and output a current, and alternating current fluctuations of a voltage at this point of connection are related to a differential input voltage. A gate of the first PMOS transistor 21 and a gate and a drain of the second PMOS transistor 22 are coupled to each other and output a current. A source of the second PMOS transistor 22 and a gate and a drain of the third PMOS transistor 23 are coupled to each other. A source of the third PMOS transistor 23 receives the first source voltage ($V_{DD1}$). A gate of the first NMOS transistor 24 and a gate and a drain of the second NMOS transistor 25 are coupled to each other and receive a current. A source of the second NMOS transistor 25 and a gate and a drain of the third NMOS transistor 26 are coupled to each other. A source of the third NMOS transistor 26 is grounded.

The power amplifier stage 4 includes a fourth PMOS transistor 41 and a fourth NMOS transistor 42. A gate of the fourth PMOS transistor 41 receives the first shift voltage produced by the level shift stage 3, a source of the fourth PMOS transistor 41 receives the second source voltage ($V_{DD2}$), a gate and a source of the fourth NMOS transistor 42 are respectively coupled to the source of the first NMOS transistor 24 and grounded, and a drain of the fourth PMOS transistor 41 and a drain of the fourth NMOS transistor 42 are coupled to each other and output an output current.

The level shift stage 3 includes a capacitor 31 having first and second capacitor terminals, a unity gain amplifier 32 having an input terminal and an output terminal, and a resistor 33. The first terminal of the capacitor 31 and the input terminal of the unity gain amplifier 32 are coupled to each other and receive the first amplified voltage, and the output terminal of the unity gain amplifier 32 is coupled to the second terminal of the capacitor 31 via the resistor 33 and outputs the first shift voltage.

The capacitor 31 stores a voltage difference between the second source voltage ($V_{DD2}$) and the first source voltage ($V_{DD1}$), and the level shift stage 3 adjusts the DC level of the first amplified voltage by an amount that is substantially equal to the voltage difference between the second source voltage ($V_{DD2}$) and the first source voltage ($V_{DD1}$). Therefore, with the voltage amplifier stage 2 and the power amplifier stage 4 operating off different source voltages, the following equations must be satisfied in order for the voltage amplifier stage 2 to operate normally:

$$V_{gs,24}+V_{gs,42}=V_{gs,25}+V_{gs,26}.$$

$$V_{sg,21}+V_{sg,41}=V_{sg,22}+V_{sg,23}.$$

At a high frequency, the AC fluctuations of a drain voltage of the first NMOS transistor 24 are transmitted to the gate of the fourth PMOS transistor 41 through the capacitor 31, while at a low frequency, are transmitted to the gate of the fourth PMOS transistor 41 through the unity gain amplifier 32 and the resistor 33.

It is to be noted that since the second source voltage ($V_{DD2}$) is larger than the first source voltage ($V_{DD1}$), the MOS transistors 21-26 of the voltage amplifier stage 2 may be realized through core devices, while the MOS transistors 41, 42 of the power amplifier stage 4 may be realized through high-voltage devices. Alternatively, the fourth PMOS transistor 41 and the fourth NMOS transistor 42 may be realized through core devices to reduce size and increase speed, and, as shown in FIG. 3, may be placed in a cascode arrangement respectively with a fifth PMOS transistor 43 and a fifth NMOS transistor 44, which are realized through high-voltage devices, to thereby realize greater protection.

Figure 3:
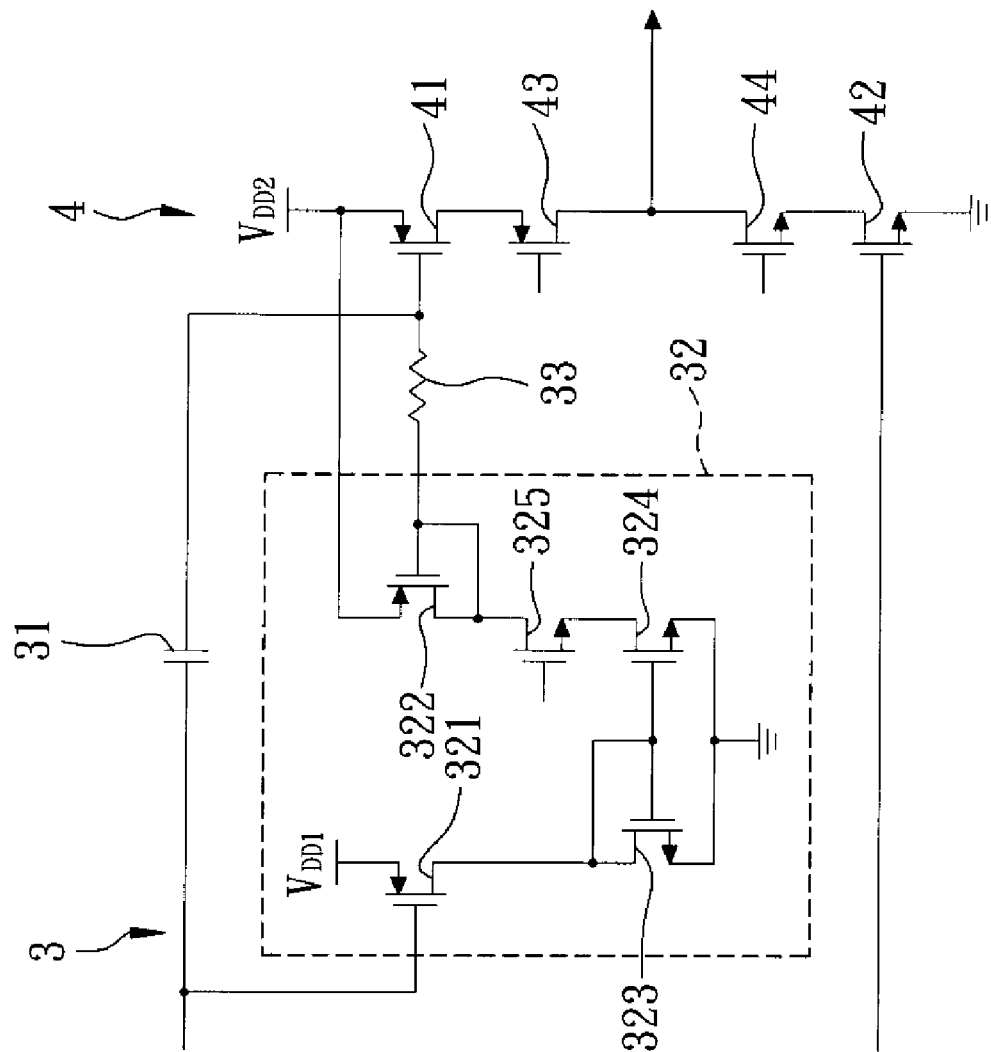
FIG. 3 is a partial schematic circuit diagram of a modified example of the first preferred embodiment, in which a unity gain amplifier of the class AB amplifier is shown in component level diagram form.

In FIG. 3, the unity gain amplifier 32 of the level shift stage 3 is shown in component level diagram form, and the alternative configuration of the power amplifier stage 4 described above is illustrated. The voltage amplifier stage 2 (see FIG. 2) is not shown in FIG. 3.

The unity gain amplifier 32 includes a sixth PMOS transistor 321, a seventh PMOS transistor 322, a sixth NMOS transistor 323, and a seventh NMOS transistor 324, which are realized through core devices, and an eighth NMOS transistor 325, which is realized through a high-voltage device. A gate of the sixth PMOS transistor 321 functions as an input terminal of the unity gain amplifier 32. A source of the sixth PMOS transistor 321 receives the first source voltage ($V_{DD1}$). A drain of the sixth PMOS transistor 321, a gate and a drain of the sixth NMOS transistor 323, and a gate of the seventh NMOS transistor 324 are coupled to each other. A source of the sixth NMOS transistor 323 and a source of the seventh NMOS transistor 324 are grounded. A source of the seventh PMOS transistor 322 receives the second source voltage ($V_{DD2}$). A gate and a drain of the seventh PMOS transistor 322 are coupled to each other, form an output terminal of the unity gain amplifier 32, and are coupled to a drain of the seventh NMOS transistor 324 via the eighth NMOS transistor 325. It is to be noted that this is merely an exemplary configuration of the unity gain amplifier 32, and other configurations capable of similar or identical operation also fall within the scope of the present invention.

In the first preferred embodiment, the power amplifier stage 4 operates off a relatively high voltage and the voltage amplifier stage 2 operates off a relatively low voltage. Hence, a voltage swing and a current drive capability of the power amplifier stage 4 may be increased, while, at the same time, the power consumption of the voltage amplifier stage 2 may be reduced.

Figure 4:
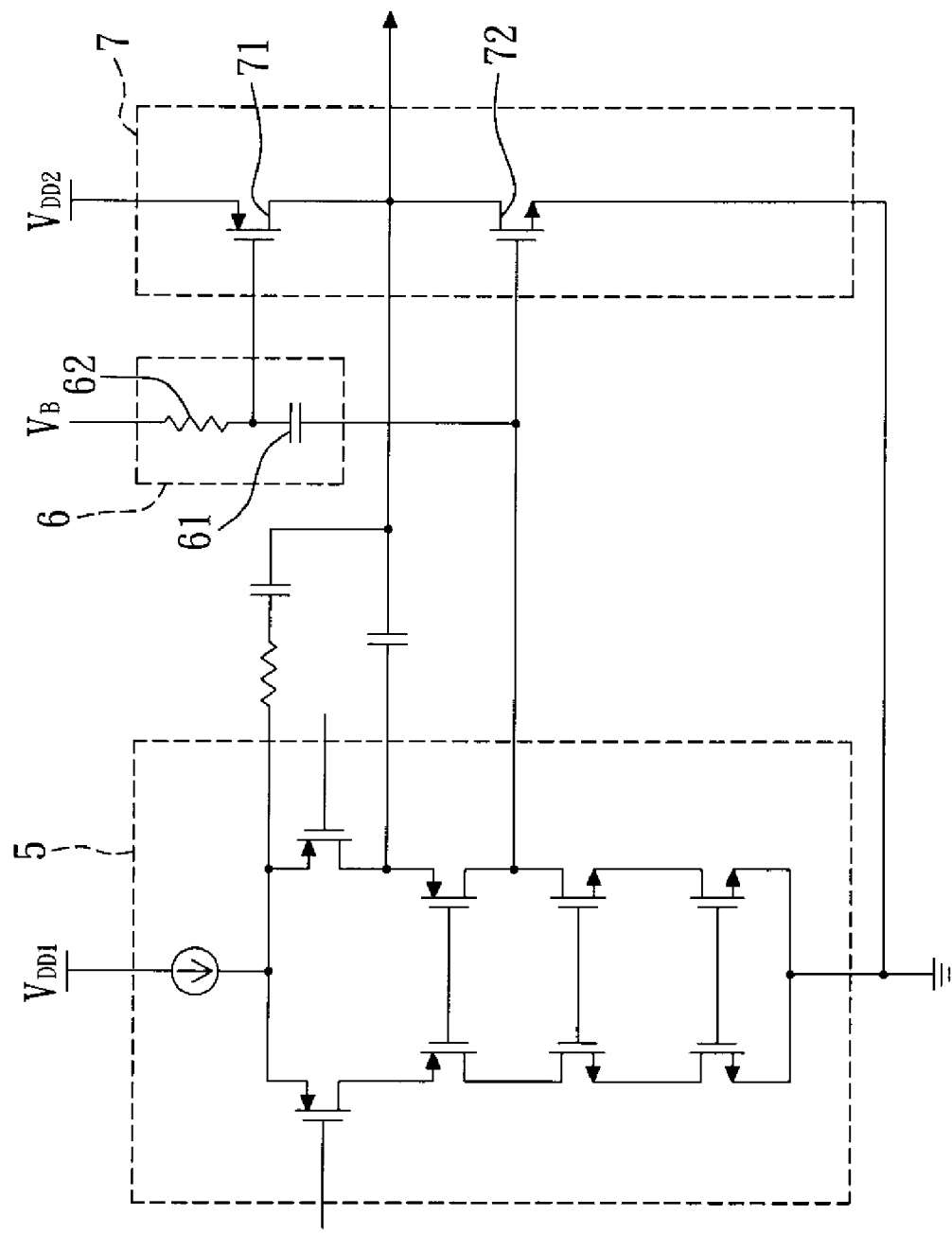
FIG. 4 is a schematic circuit diagram of a class AB amplifier according to a second preferred embodiment of the present invention.

Referring to FIG. 4, a class AB amplifier according to a second preferred embodiment of the present invention comprises a voltage amplifier stage 5, a level shift stage 6, and a power amplifier stage 7. The voltage amplifier stage 5 operates off a first source voltage ($V_{DD1}$), and amplifies a differential input voltage to produce a first amplified voltage. The voltage amplifier stage 5 of this embodiment has a cascode arrangement but should not be limited thereto.

The power amplifier stage 7 includes a first PMOS transistor 71 and a first NMOS transistor 72. A source of the first PMOS transistor 71 receives a second source voltage ($V_{DD2}$), a source of the first NMOS transistor 72 is grounded, a gate of the first NMOS transistor 72 receives the first amplified voltage, and a drain of the first PMOS transistor 71 and a drain of the first NMOS transistor 72 are coupled to each other and output an output current.

The level shift stage 6 includes a capacitor 61 and a resistor 62. The capacitor 61 has a first capacitor terminal for receiving the first amplified voltage, and a second capacitor terminal. The resistor 62 has a first resistor terminal for receiving a bias voltage ($V_B$), and a second resistor terminal. The second capacitor terminal of the capacitor 61 and the second resistor terminal of the resistor 62 are coupled to each other and output a first shift voltage to a gate of the first PMOS transistor 71.

Unlike the first embodiment, the capacitor 61 stores a voltage difference between the bias voltage ($V_B$) and the first source voltage ($V_{DD1}$), and the level shift stage 6 adjusts the DC level of the first amplified voltage by an amount that is substantially equal to this voltage difference between the bias voltage ($V_B$) and the first source voltage ($V_{DD1}$). Therefore, the voltage amplifier stage 5 and the power amplifier stage 7 may operate using different source voltages. In this embodiment, the power amplifier stage 7 operates off a relatively high voltage and the voltage amplifier stage 5 operates off a relatively low voltage. Hence, a voltage swing and a current drive capability of the power amplifier stage 7 may be increased, while, at the same time, the power consumption of the voltage amplifier stage 5 may be reduced.

At a high frequency, the AC fluctuations of the first amplified voltage may be transmitted to the gate of the first PMOS transistor 71 through the capacitor 61. Consequently, this embodiment is suitable for operation at high frequencies. However, at a low frequency, although AC fluctuations are unable to be transmitted to the gate of the first PMOS transistor 71 through the capacitor 61, this embodiment may still function as a class A amplifier.

It is to be noted that since the second source voltage ($V_{DD2}$) is larger than the first source voltage ($V_{DD1}$), the voltage amplifier stage 5 may be realized through core devices, while the MOS transistors 71, 72 of the power amplifier stage 7 may be realized through high-voltage devices. Alternatively, the first PMOS transistor 71 and the first NMOS transistor 72 may be realized through core devices to reduce size and increase speed, and may be placed in a cascode arrangement respectively with a second PMOS transistor (not shown) and a second NMOS transistor (not shown), which are realized through high-voltage devices, to thereby realize greater protection.

Figure 5:
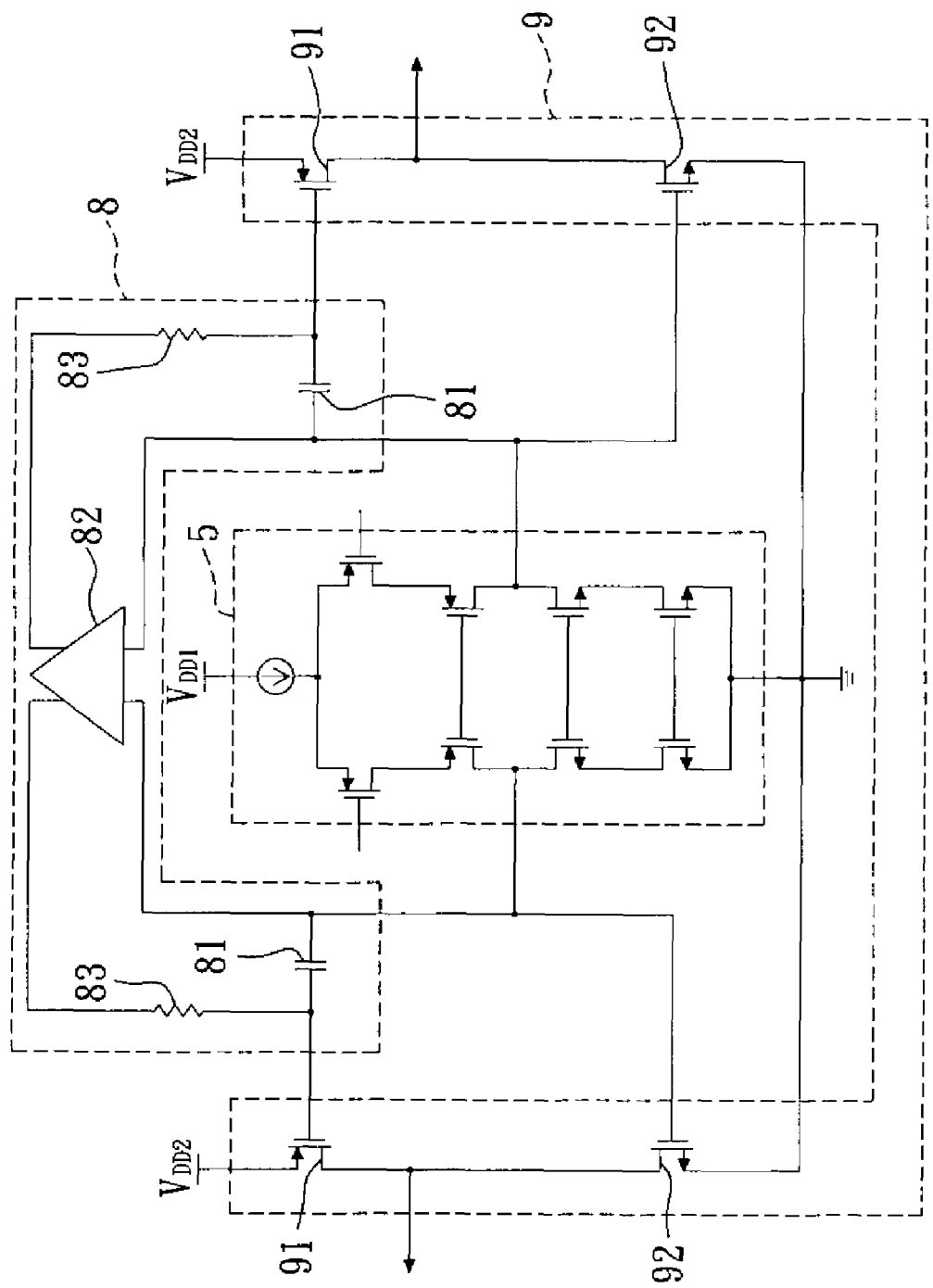
FIG. 5 is a schematic circuit diagram of a class AB amplifier according to a third preferred embodiment of the present invention.

Referring to FIG. 5, a class AB amplifier according to a third preferred embodiment of the present invention comprises a voltage amplifier stage 5, a level shift stage 8, and a power amplifier stage 9. The voltage amplifier stage 5 operates off a first source voltage ($V_{DD1}$), and amplifies a differential input voltage to produce first and second amplified voltages. The voltage amplifier stage 5 of this embodiment has a cascode arrangement but should not be limited thereto.

The power amplifier stage 9 includes a pair of first PMOS transistors 91 and a pair of first NMOS transistors 92. Sources of the first PMOS transistors 91 receive a second source voltage ($V_{DD2}$), sources of the first NMOS transistor 92 are grounded, gates of the first NMOS transistors 92 receive respectively the first and second amplified voltages, and a drain of each of the first PMOS transistors 91 is coupled to a drain of a respective one of the first NMOS transistors 92 for outputting a corresponding one of first and second output currents.

The level shift stage 8 includes a pair of capacitors 81, a unity gain amplifier 82 having two input terminals and two output terminals, and a pair of resistors 83. The capacitors 81 have first capacitor terminals coupled respectively to the input terminals of the unity gain amplifier 82 and receiving respectively the first and second amplified voltages, and second capacitor terminals coupled respectively to the output terminals of the unity gain amplifier 82 respectively through the resistors 83 and outputting first and second shift voltages respectively to gates of the first PMOS transistors 91 of the power amplifier stage 9. Hence, the power amplifier stage 9 converts the first and second shift voltages to produce the first and second output currents.

Each of the capacitors 81 stores a voltage difference between the second source voltage ($V_{DD2}$) and the first source voltage ($V_{DD1}$). The level shift stage 8 adjusts the DC level of each of the first and second amplified voltages by an amount that is substantially equal to the voltage difference between the second source voltage ($V_{DD2}$) and the first source voltage ($V_{DD1}$). Therefore, the voltage amplifier stage 5 and the power amplifier stage 9 may operate using different source voltages. In this embodiment, the power amplifier stage 9 operates off a relatively high voltage and the voltage amplifier stage 5 operates off a relatively low voltage. Hence, a voltage swing and a current drive capability of the power amplifier stage 9 may be increased, while, at the same time, the power consumption of the voltage amplifier stage 5 may be reduced.

At a high frequency, the AC fluctuations of the amplified voltages may be transmitted to the gates of the first PMOS transistors 91 respectively through the capacitors 81, while at a low frequency, the AC fluctuations may be transmitted to the gates of the first PMOS transistors 91 respectively through the unity gain amplifier 82 and the resistors 83.

Figure 7:
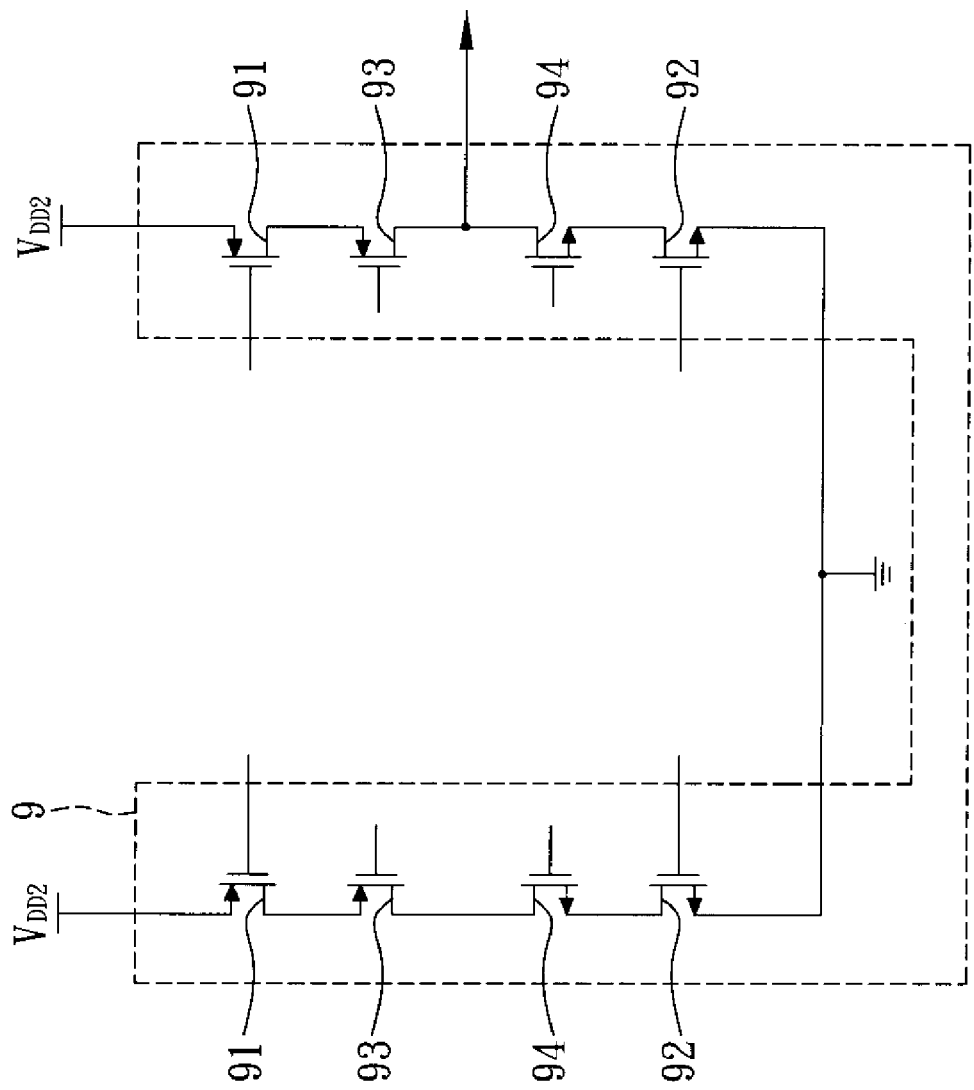
FIG. 7 is a partial schematic circuit diagram of the third preferred embodiment, illustrating a modified example of a power amplifier stage of the class AB amplifier.

It is to be noted that since the second source voltage ($V_{DD2}$) is larger than the first source voltage ($V_{DD1}$), the voltage amplifier stage 5 may be realized through core devices, while the MOS transistors 91, 92 of the power amplifier stage 9 may be realized through high-voltage devices. Alternatively, with reference to FIG. 7, the first PMOS transistors 91 and the first NMOS transistors 92 may be realized through core devices to reduce size and increase speed, and the first PMOS transistors 91 may be placed in a cascode arrangement respectively with second PMOS transistors 93 realized through high-voltage devices, and the first NMOS transistors 92 may be placed in a cascode arrangement respectively with second NMOS transistors 94 realized through high-voltage devices to thereby realize greater protection.

Figure 6:
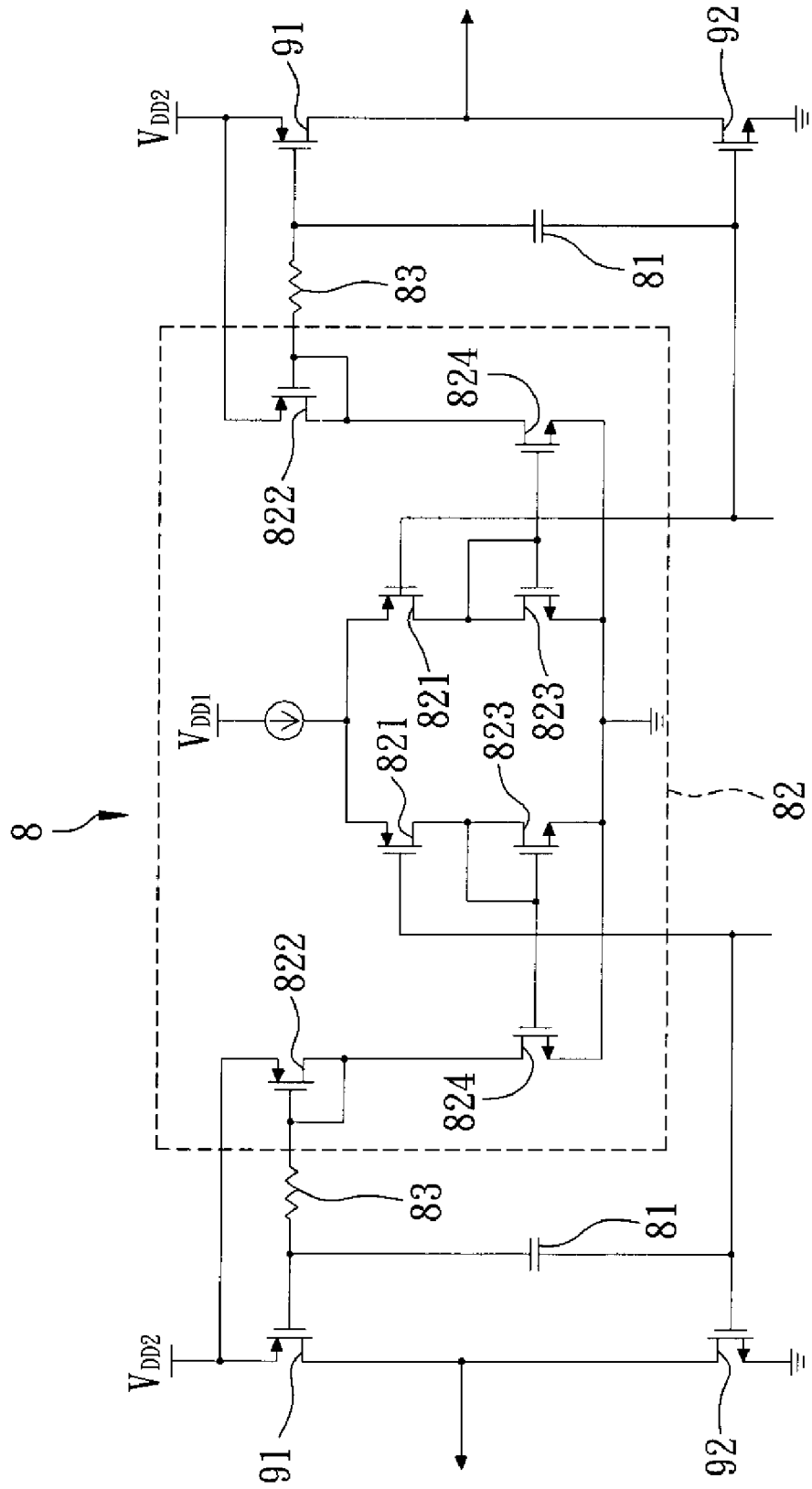
FIG. 6 is a partial schematic circuit diagram of the third preferred embodiment, in which a unity gain amplifier of the class AB amplifier is shown in component level diagram form.

Referring to FIG. 6, the unity gain amplifier 82 of the class AB amplifier of the third preferred embodiment is shown in component level diagram form. The unity gain amplifier 82 includes a pair of third PMOS transistors 821, a pair of third NMOS transistors 823, and a pair of fourth NMOS transistors 824, which are realized through core devices, and a pair of fourth PMOS transistors 822, which are realized through high-voltage devices. Gates of the third PMOS transistors 821 form input terminals of the unity gain amplifier 82. Sources of the third PMOS transistors 821 are coupled to each other and receive a current. A drain of each of the third PMOS transistors 821, a gate and a drain of a corresponding one of the third NMOS transistors 823, and a gate of a corresponding one of the fourth NMOS transistors 824 are coupled to each other. Sources of the third NMOS transistors 823 and sources of the fourth NMOS transistors 824 are grounded. Sources of the fourth PMOS transistors 822 receive the second source voltage ($V_{DD2}$). A gate and a drain of each of the fourth PMOS transistors 822 are coupled to a drain of a corresponding one of the fourth NMOS transistors 824 for forming an output terminal of the unity gain amplifier 82. It is to be noted that this is merely an exemplary configuration of the unity gain amplifier 82, and other configurations capable of similar or identical operation also fall within the scope of the present invention.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A class AB amplifier, comprising:
   a voltage amplifier stage operating off a first source voltage, and amplifying a differential input voltage to produce a first amplified voltage;
   a level shift stage coupled to said voltage amplifier stage and adjusting a direct current (DC) level of the first amplified voltage to produce a first shift voltage; and
   a power amplifier stage coupled to said level shift stage, operating off a second source voltage, and converting the first shift voltage to produce a first output current;
   wherein the second source voltage is larger than the first source voltage; and
   wherein said level shift stage includes at least one capacitor.

2. The class AB amplifier of claim 1, wherein said voltage amplifier stage has a floating gate structure.

3. The class AB amplifier of claim 1, wherein said level shift stage adjusts the DC level of the first amplified voltage by an amount that is substantially equal to a voltage difference between the second source voltage and the first source voltage.

4. The class AB amplifier of claim 1, wherein said level shift stage further includes a unity gain amplifier and a resistor, said unity gain amplifier having an input terminal for receiving the first amplified voltage, and an output terminal coupled to said resistor for outputting the first shift voltage via said resistor.

5. The class AB amplifier of claim 4, wherein said unity gain amplifier includes a sixth PMOS transistor, a seventh PMOS transistor, a sixth NMOS transistor, a seventh NMOS transistor, and an eighth NMOS transistor, a gate of said sixth PMOS transistor functioning as an input terminal of said unity gain amplifier, a source of said sixth PMOS transistor receiving the first source voltage, a drain of said sixth PMOS transistor, a gate and a drain of said sixth NMOS transistor, and a gate of said seventh NMOS transistor being coupled to each other, a source of said sixth NMOS transistor and a source of said seventh NMOS transistor being grounded, a source of said seventh PMOS transistor receiving the second source voltage, and a gate and a drain of said seventh PMOS transistor being coupled to each other, forming an output terminal of said unity gain amplifier, and being coupled to a drain of said seventh NMOS transistor via said eighth NMOS transistor.

6. The class AB amplifier of claim 5, wherein said sixth PMOS transistor, said seventh PMOS transistor, said sixth NMOS transistor, and said seventh NMOS transistor are realized through core devices, and said eighth NMOS transistor is realized through a high-voltage device.

7. The class AB amplifier of claim 1, wherein said voltage amplifier stage is realized through core devices, and said power amplifier stage is realized through high-voltage devices.

8. The class AB amplifier of claim 1, wherein said power amplifier stage includes a fourth PMOS transistor and a fourth NMOS transistor, and a fifth PMOS transistor and a fifth NMOS transistor placed in a cascode arrangement respectively with said fourth PMOS transistor and said fourth NMOS transistor, said voltage amplifier stage, said fourth PMOS transistor, and said fourth NMOS transistor being realized through core devices, and said fifth PMOS transistor and said fifth NMOS transistor being realized through high-voltage devices.

9. The class AB amplifier of claim 1, wherein said level shift stage adjusts the DC level of the first amplified voltage by an amount that is substantially equal to a voltage difference between a bias voltage and the first source voltage.

10. The class AB amplifier of claim 1, wherein said level shift stage further includes a resistor, said at least one capacitor having a first capacitor terminal for receiving the first amplified voltage, and a second capacitor terminal, said resistor having a first resistor terminal for receiving a bias voltage, and a second resistor terminal, said second capacitor terminal of said at least one capacitor and said second resistor terminal of said resistor being coupled to each other and outputting the first shift voltage.

11. The class AB amplifier of claim 10, wherein said level shift stage adjusts the DC level of the first amplified voltage by an amount that is substantially equal to a voltage difference between the bias voltage and the first source voltage.

12. The class AB amplifier of claim 1, wherein said voltage amplifier stage has a cascode arrangement.

13. The class AB amplifier of claim 1, wherein said voltage amplifier stage further produces a second amplified voltage, said level shift stage further adjusts a DC level of the second amplified voltage to produce a second shift voltage, and said power amplifier stage further converts the second shift voltage to produce a second output current.

14. The class AB amplifier of claim 12, wherein said level shift stage adjusts the DC level of each of the first and second amplified voltages by an amount that is substantially equal to a voltage difference between the second source voltage and the first source voltage.

15. The class AB amplifier of claim 13, wherein said level shift stage further includes a unity gain amplifier having two input terminals and two output terminals, and a pair of resistors, said at least one capacitor includes a pair of capacitors, said pair of capacitors having first capacitor terminals coupled respectively to said input terminals of said unity gain amplifier and receiving respectively the first and second amplified voltages, and second capacitor terminals coupled respectively to said output terminals of said unity gain amplifier respectively through said pair of resistors and outputting the first and second shift voltages, respectively.

16. The class AB amplifier of claim 15, wherein said unity gain amplifier includes a pair of third PMOS transistors, a pair of third NMOS transistors, a pair of fourth NMOS transistors, and a pair of fourth PMOS transistors, gates of said third PMOS transistors forming input terminals of said unity gain amplifier, sources of said third PMOS transistors being coupled to each other, a drain of each of said third PMOS transistors, a gate and a drain of a corresponding one of said third NMOS transistors, and a gate of a corresponding one of said fourth NMOS transistors being coupled to each other, sources of said third NMOS transistors and sources of said fourth NMOS transistors being grounded, sources of said fourth PMOS transistors receiving the second source voltage, and a gate and a drain of each of said fourth PMOS transistors being coupled to a drain of a corresponding one of said fourth NMOS transistors for forming an output terminal of said unity gain amplifier.

17. The class AB amplifier of claim 16, wherein said third PMOS transistors, said third NMOS transistors, and said fourth NMOS transistors are realized through core device and said fourth PMOS transistors are realized through high-voltage devices.

18. The class AB amplifier of claim 13, wherein said power amplifier stage includes a pair of first PMOS transistors and a pair of first NMOS transistors, sources of said first PMOS transistors receiving the second source voltage, sources of said first NMOS transistors being grounded, gates of said first PMOS transistors respectively receiving the first and second shift voltages, gates of said first NMOS transistors respectively receiving the first and second amplified voltages, and a drain of each of said first PMOS transistors being coupled to a drain of a respective one of said first NMOS transistors for outputting a corresponding one of the first and second output currents.

19. The class AB amplifier of claim 16, wherein said power amplifier stage further includes a pair of second PMOS transistors placed in a cascode arrangement respectively with said first PMOS transistors, and a pair of second NMOS transistors placed in a cascode arrangement respectively with said first NMOS transistors, said voltage amplifier stage, said first PMOS transistors of said power amplifier stage, and said first NMOS transistors of said power amplifier stage being realized through core devices, and said second PMOS transistors and said second NMOS transistors of said power amplifier stage being realized through high-voltage devices.

* * * * *